(12) United States Patent
Kawashima

(10) Patent No.: US 11,276,702 B2
(45) Date of Patent: Mar. 15, 2022

(54) SEMICONDUCTOR DEVICE

(71) Applicant: RENESAS ELECTRONICS CORPORATION, Tokyo (JP)

(72) Inventor: Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 147 days.

(21) Appl. No.: 16/854,399

(22) Filed: Apr. 21, 2020

(65) Prior Publication Data

US 2020/0402989 A1 Dec. 24, 2020

(30) Foreign Application Priority Data

Jun. 20, 2019 (JP) .............................. JP2019-114431

(51) Int. Cl.
| | |
|---|---|
| *H01L 31/028* | (2006.01) |
| *H01L 27/088* | (2006.01) |
| *H01L 27/11556* | (2017.01) |
| *H01L 27/11582* | (2017.01) |
| *G11C 5/06* | (2006.01) |
| *G11C 5/02* | (2006.01) |

(52) U.S. Cl.
CPC ........ *H01L 27/11556* (2013.01); *G11C 5/025* (2013.01); *G11C 5/06* (2013.01); *H01L 27/0886* (2013.01); *H01L 27/11582* (2013.01)

(58) Field of Classification Search
CPC ....... G11C 5/025; G11C 5/06; H01L 27/0886; H01L 27/11556; H01L 27/11582

USPC .......................................................... 257/314
See application file for complete search history.

(56) References Cited

U.S. PATENT DOCUMENTS

| | | | |
|---|---|---|---|
| 9,543,315 B1* | 1/2017 | Chakihara | ......... H01L 27/11573 |
| 10,043,814 B2 | 8/2018 | Yamashita | |
| 10,249,638 B2* | 4/2019 | Yamashita | ...... H01L 21/823821 |
| 2016/0064397 A1* | 3/2016 | Hayashi | ............ H01L 29/40117 |
| | | | 438/275 |
| 2020/0403073 A1* | 12/2020 | Mihara | ............. H01L 29/42344 |

FOREIGN PATENT DOCUMENTS

JP 2017-045860 A 3/2017

\* cited by examiner

*Primary Examiner* — Long K Tran
(74) *Attorney, Agent, or Firm* — McDermott Will & Emery LLP

(57) ABSTRACT

Fins lined up in a Y direction, a control gate electrode and a memory gate electrode each extending in the Y direction so as to straddle the fins, a plurality of first plugs electrically connected with a drain region formed in each of the fins, and a plurality of second plugs electrically connected with a source region formed in each of the fins are formed. Here, a N-th plug of the plurality of first plugs lined up in the Y direction is coupled with each of (2N−1)-th and 2N-th fins in the Y direction. Also, a N-th plug of the plurality of second plugs lined up in the Y direction is coupled with each of 2N-th and (2N+1)-th fins in the Y direction.

7 Claims, 9 Drawing Sheets

FIG. 8

| APPLIED VOLTAGE / OPERATION | Vd | Vcg | Vmg | Vs | Vb |
|---|---|---|---|---|---|
| WRITE | Vdd | 1V | 12V | 6V | 0 |
| ERASE | 0 | 0 | -6V | 6V | 0 |
| READ | Vdd | Vdd | 0 | 0 | 0 |

Vdd = 1.5V

SEMICONDUCTOR DEVICE

CROSS-REFERENCE TO RELATED APPLICATIONS

The disclosure of Japanese Patent Application No. 2019-114431 filed on Jun. 20, 2019 including the specification, drawings and abstract is incorporated herein by reference in its entirety.

BACKGROUND

The present invention relates to a semiconductor device, and more particularly, the present invention relates to a technique useful for a semiconductor device including a fin-type transistor.

A fin transistor is known as a transistor that has a high operating speed, that can reduce leakage current and power consumption, and that can be miniaturized. The fin-type field-effect transistor (FINFET: Fin Field Effect Transistor) is, for example, a semiconductor device having a pattern of a plate-shaped semiconductor layer, which is protruded from a substrate, as a channel layer and having a gate electrode formed so as to straddle the pattern.

EEPROM (Electrically Erasable and Programmable Read Only Memory) is widely used as a non-volatile memory device which can be electrically written and erased. The storage device represented by the flash memory widely used at present has a conductive floating gate electrode or a trapping insulating film, which are surrounded by an oxide film, below a gate electrode of a MISFET. Also, a charge accumulation state in the floating gate or the trapping insulating film is used as storage information and the stored state is read as a threshold value of a transistor. The trapping insulating film is an insulating film capable of storing charges, and as an example, a silicon nitride film or the like can be given. The threshold value of MISFET is shifted by injecting and discharging charges into and from the charge storage region to operate as memory elements. As the flash memory, there is a split-gate type cell using a MONOS (Metal-Oxide-Nitride-Oxide-Semiconductor) film.

There is disclosed techniques listed below.
[Patent Document 1] Japanese Unexamined Patent Application Publication No. 2017-45860.

Patent Document 1 discloses a MONOS memory cell made of FINFET.

SUMMARY

When a plurality of fins is lined up in a transverse direction crossing to an extending direction thereof, the distance between the fins arranged next to each other becomes small, as a semiconductor device is miniaturized. Therefore, a contact plug connected with a source region or a drain region of FINFET formed on each fin is formed so as to extend over two or more fins in the transverse direction. Thus, the area required for forming the memory cells of 1-bit portions becomes large. Accordingly, miniaturization of a semiconductor device becomes difficult.

Other purpose and novel features will become apparent from the description of this specification and the accompanying drawings.

The typical ones of the embodiments disclosed in the present application will be briefly described as follows.

A semiconductor device according to an embodiment comprises first through third fins each protruded from an upper surface of a semiconductor substrate and each extended in a first direction. Each of the first through third fins is a part of the semiconductor substrate. Also, the first through third fins are lined up in order in a second direction crossing to the first direction. The semiconductor device according to the embodiment further comprises a control gate electrode and a memory gate electrode, which are arranged next to each other in the first direction. Each of the control gate electrode and the memory gate electrode is extended in the second direction so as to straddle the first through third fins. The semiconductor device according to the embodiment further comprises a source region and a drain region, which are formed in each fin. The semiconductor device according to the embodiment further comprises a first plug connected with the drain region of each of the first fin and the second fin, and a second plug connected with the source region of each of the second fin and the third fin. Also, the source region formed in the second fin, the drain region formed in the second fin, the control gate electrode on the second fin and the memory gate electrode on the second fin compose a memory cell.

According to the embodiment disclosed in the present application, the performance of a semiconductor device can be improved. In particular, the area per 1-bit of the fin-type MONOS memory can be reduced and a semiconductor device can be miniaturized.

BRIEF DESCRIPTION OF THE DRAWINGS

FIG. 8 is a table illustrating an example of the conditions of applying a voltage to each portion of the selected memory cell during "WRITE", "ERASE" and "READ".

DETAILED DESCRIPTION

Figure 1:
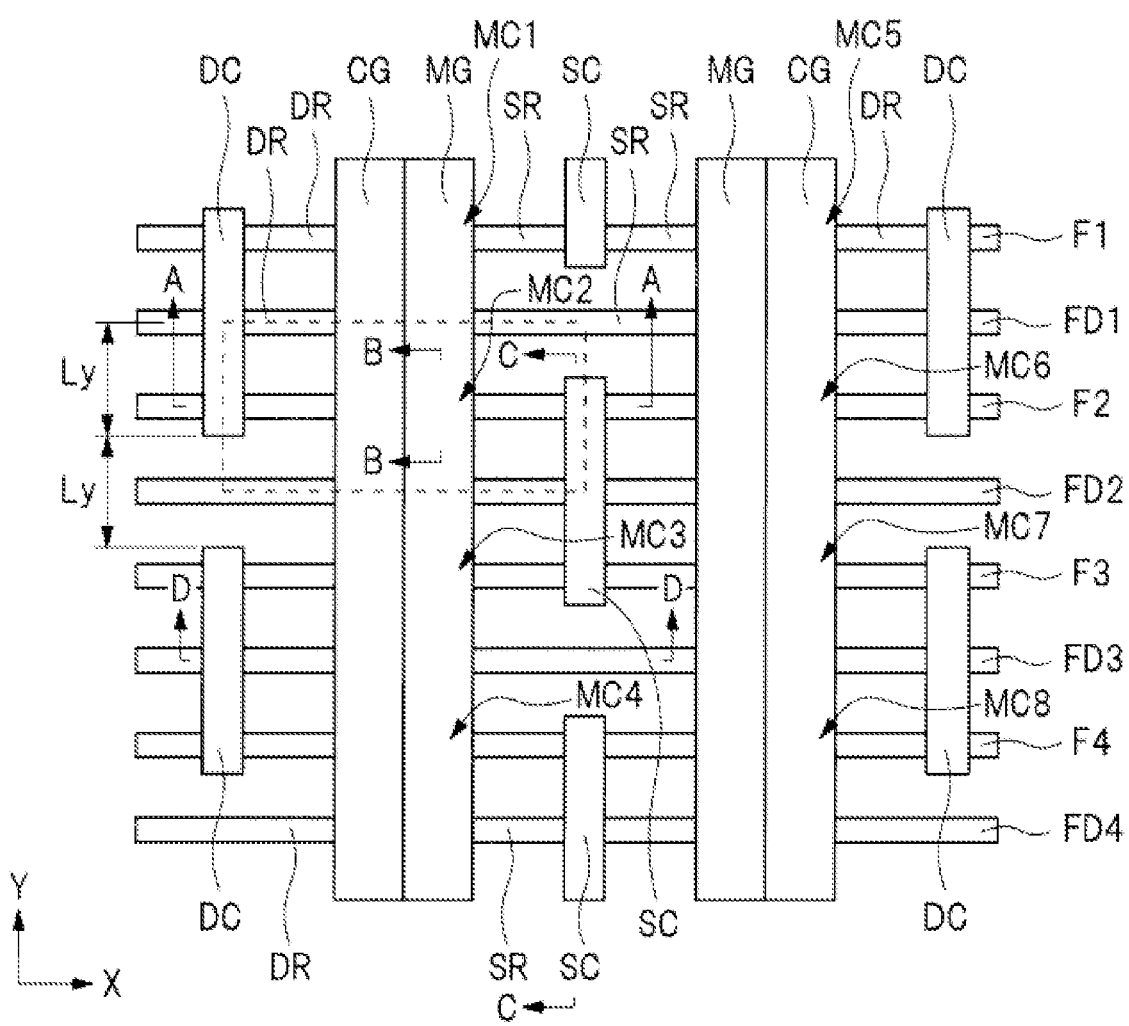
FIG. 1 is a plan view of a semiconductor device according to an embodiment of the present application.

In the following embodiments, when required for convenience, the description will be made by dividing into a plurality of sections or embodiments, but except when specifically stated, they are not independent of each other, and one is related to the modified example, detail, supplementary description, or the like of part or all of the other. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The embodiments would be explained below in detail based on each drawing. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary. In addition, in the drawings for explaining the embodiments, hatching may be applied to a plan view, a perspective view, or the like in order to make the configuration easy to understand.

Figure 2:
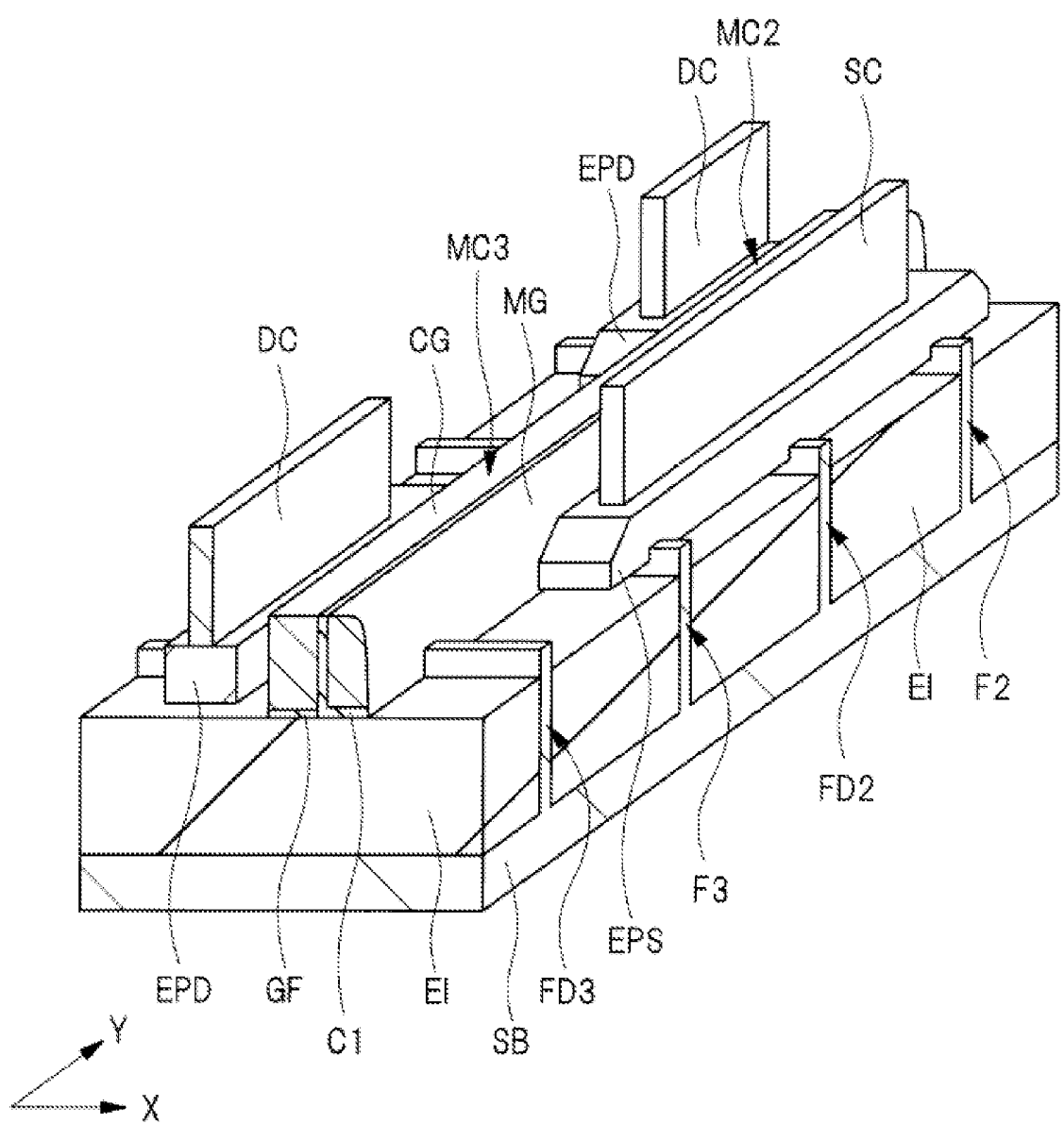
FIG. 2 is a perspective view of the semiconductor device according to an embodiment of the present application.
Figure 3:
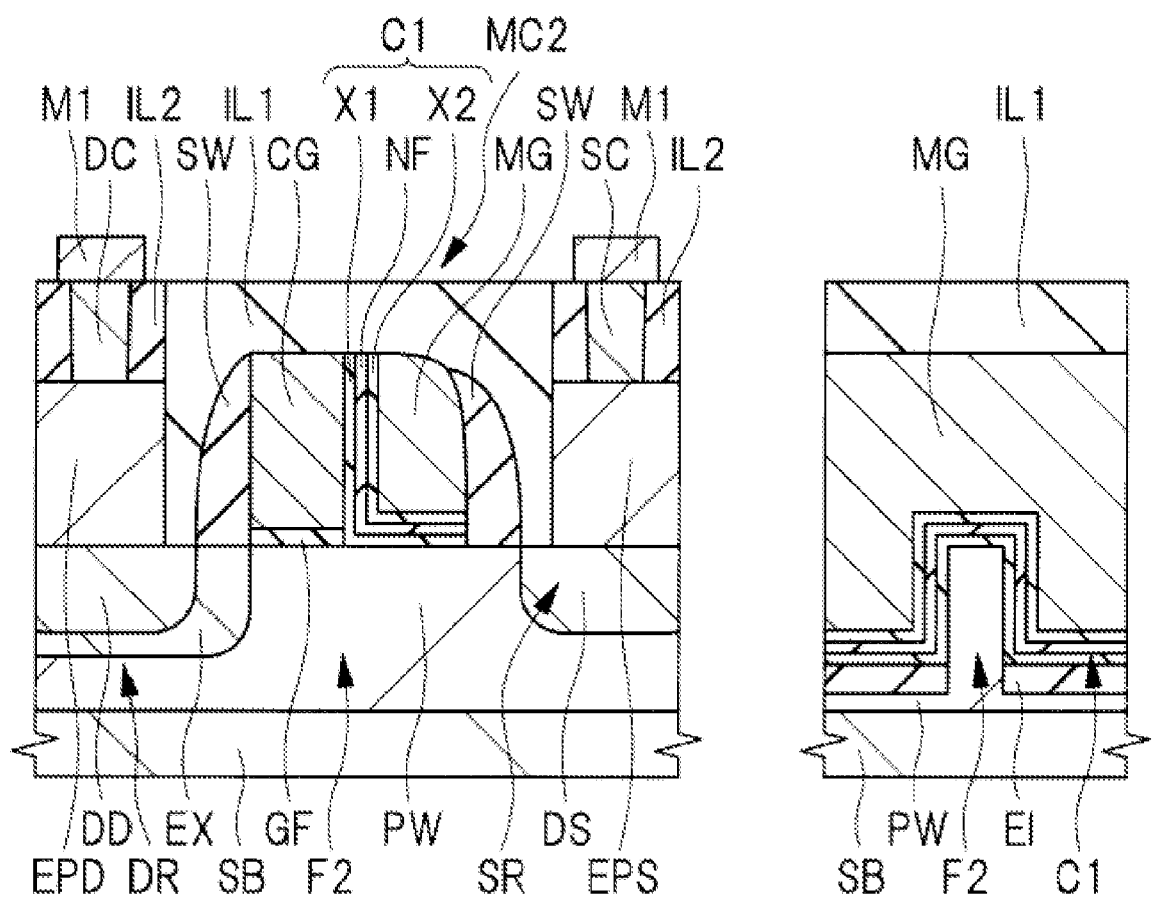
FIG. 3 is a cross-section view along lines A-A and line B-B of FIG. 1.
Figure 4:
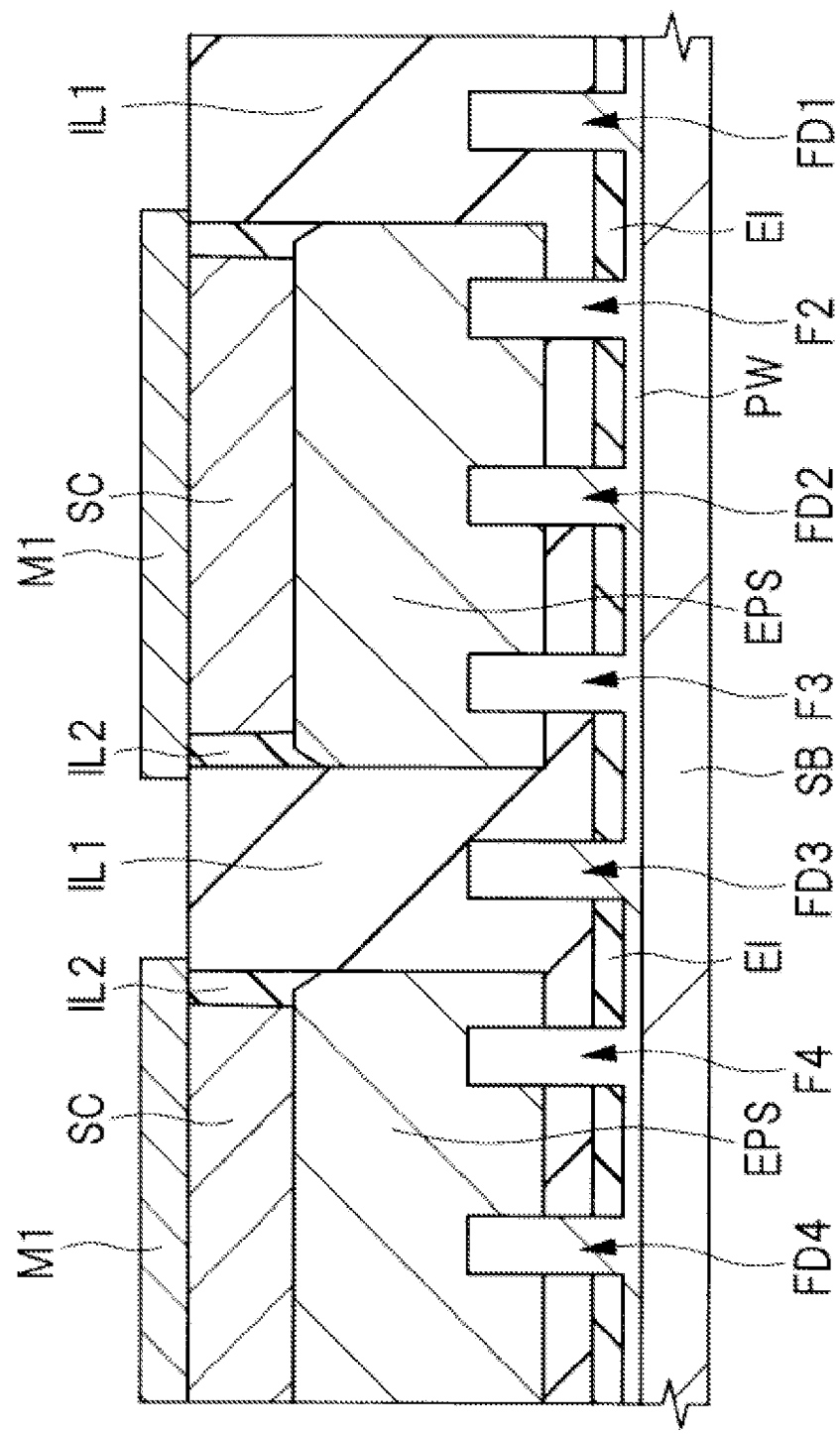
FIG. 4 is a cross-section view along line C-C of FIG. 1.
Figure 5:
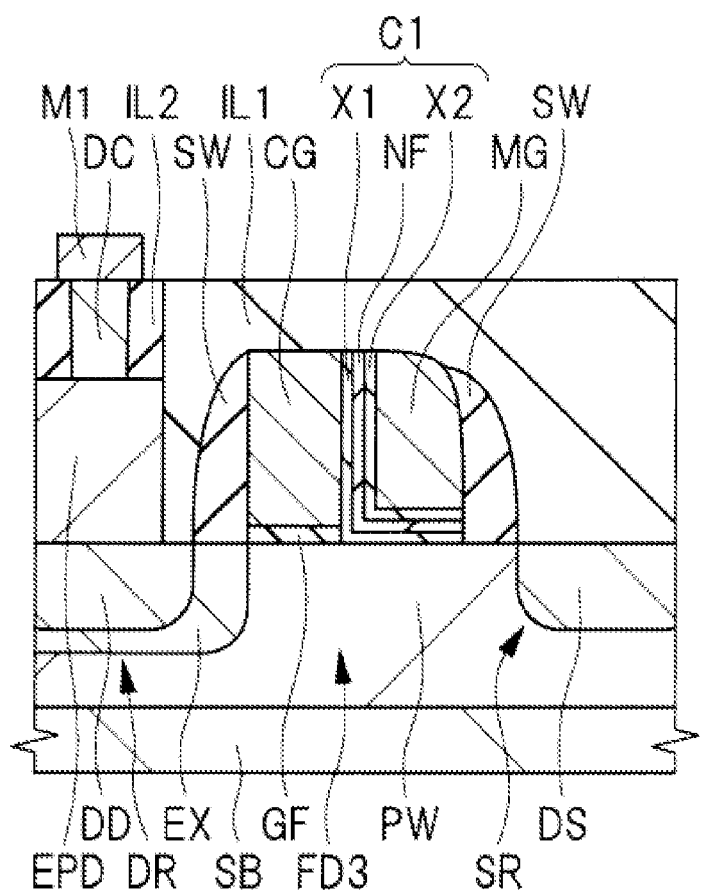
FIG. 5 is a cross-section view along line D-D of FIG. 1.
Figure 6:
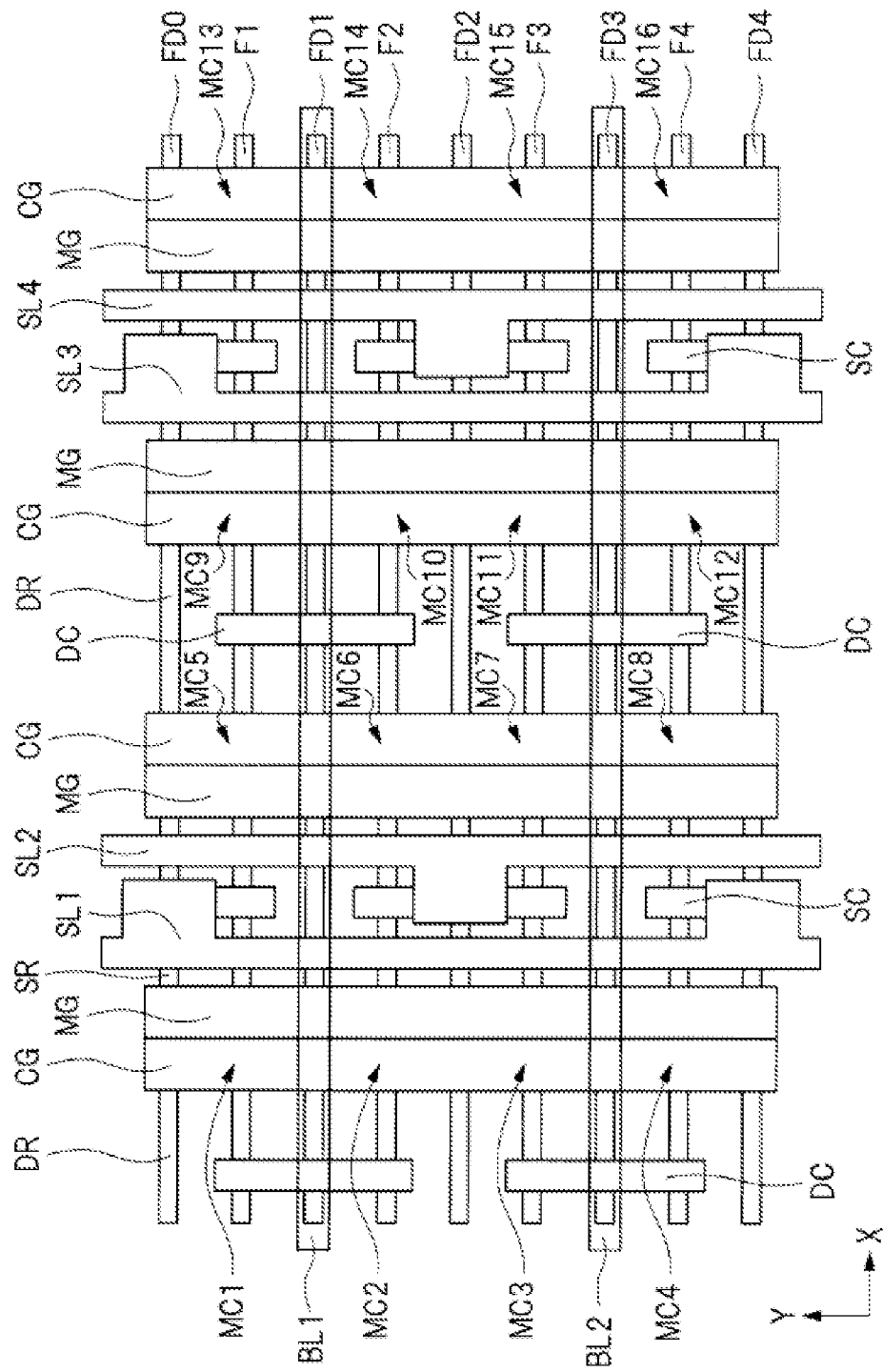
FIG. 6 is a plan view of the semiconductor device according to the embodiment of the present application.

Hereinafter, a structure of a semiconductor device of the present embodiment will be described with reference to FIGS. 1 to 6. FIG. 1 is a plan view of the semiconductor device according to the present embodiment. FIG. 2 is a perspective view of the semiconductor device according to the present embodiment. FIGS. 3-5 are a cross-sectional view of the semiconductor device according to the present embodiment. In FIG. 1, only fins, gate electrodes and plugs are shown. In FIG. 2, the source and drain regions, the interlayer insulating film covering the memory cell, and the wiring layer on the interlayer insulating film are not shown. In FIG. 3, a cross sectional along line A-A of FIG. 1 and a cross section along line B-B of FIG. 1 are shown in order from the left. FIG. 4 is a cross-sectional view along line C-C of FIG. 1. FIG. 5 is a cross-sectional view along line D-D of FIG. 1. In FIG. 6, only fins, gate electrodes, plugs, and some wires are shown. In FIG. 2, the illustration of the wells is omitted. In FIG. 4, illustration of the source and drain regions is omitted.

FIGS. 1-2 show a memory cell region including a memory cell array formed by arranging a plurality of memory cells which are non-volatile storage element. The memory cell region is a region in which a non-volatile memory (electrically erasable programmable read-only memory) that is capable of electrically rewriting stored information is formed in a semiconductor chip, by a write operation and an erase operation. In the memory cell area, a plurality of fins F1 to F4 and FD1 to FD4 each extending in the X direction are lined up in the Y direction at equal intervals. Each of the X and Y directions is a direction along an upper surface of a semiconductor substrate SB, and the X direction intersects with the Y direction. Each of the fins F1 to F4 and FD1 to FD4 is, for example, a rectangular parallelepiped protruding portion selectively protruded from the upper surface of the semiconductor substrate SB, and has plate-like shapes. Specifically, the fins F1, FD1, F2, FD2, F3, FD3, F4 and FD4 are arranged in this order in the Y direction.

The direction in which each of the fins F1 to F4 and FD1 to FD4 extends in plan view is the longitudinal direction (long side direction, extension direction) of each fin, and the direction crossing the longitudinal direction is the transverse direction (short side direction) of each fin. That is, the length of the fin is greater than the width of the fin. The fins F1 to F4 and FD1 to FD4 may have any shapes as long as they are protruding portion having a length, a width, and a height. For example, it may have a layout meandering in plan view.

The lower end portions of the fins F1 to F4 and FD1 to FD4 are surrounded by the device isolation film EI covering upper surface of semiconductor substrate SB in plan view. That is, among the fins F1 to F4 and FD1 to FD4, a space between the fins arranged next to each other in plan view is filled with the device isolation film EI. Each of the fins F1 to F4 and FD1 to FD4 is a part of the semiconductor substrate SB and is the active area of the semiconductor substrate SB. However, the fins F1 to F4 are active regions for forming the memory cells MC1 to MC8, respectively, while the memory cells are not respectably formed in the fin FD1 to FD4. That is, the fins FD1 to FD4 is a dummy fin, i.e., a pseudo-fin, and a channel of the transistor is not formed in each of the fins FD1 to FD4.

Each of the fins F1 to F4 and FD1 to FD4 is a portion of semiconductor substrate SB that has been etched back by the upper surface of semiconductor substrate SB and thus remains in a plate-like shape between the grooves formed thereby. However, "upper surface of semiconductor substrate" in the present application is defined to refer to the surfaces of semiconductor substrate located between the fins arranged next to each other in a memory cell array (memory cell area) in which a plurality of memory cells composed of fin-type field-effect transistors (FINFET) are formed. That is, when "upper surface of semiconductor substrate" is used herein, upper surface does not refer to upper surface of the fin, but refers to the bottom surface of the trench covered with the device isolation film around the fin.

A plurality of control gate electrodes CG and a plurality of memory gate electrodes MG extending in the Y direction are formed on the fins F1 to F4 and the fins FD1 to FD4. The control gate electrode CG and the memory gate electrode MG are adjacent to each other via an insulating film C1, which is an Oxide Nitride Oxide film including a charge storage portion. Here, the insulating film between the memory gate electrode MG and each of the fins F1 to F4 and FD1 to FD4 needs to be a film including a charge storage portion, for example, an ONO film. However, the insulating film between the control gate electrode CG and the memory gate electrode MG may be an insulating film comprised of, for example, a silicon oxide film or a silicon nitride film. Therefore, the insulating film between the control gate electrode CG and the memory gate electrode MG does not need to be the same film formed continuously with the insulating film directly under the memory gate electrode MG, and may be a stacked film or a single-layer film.

In each of the fins F1 to F4 and FD1 to FD4, a source region SR and a drain region DR, which are n type semiconductor regions, are formed from the surfaces of the fins F1 to F4 and FD1 to FD4 to the inside of the source region SR and the drain region DR, respectively. The source region SR and the drain region DR formed in one fin are arranged so as to sandwich the control gate electrode CG and the memory gate electrode MG in plan view, the drain region DR is arranged on the control gate electrode CG side, and the source region SR is arranged on the memory gate electrode side. That is, in the X direction, one control gate electrode CG and one memory gate electrode MG adjacent to each other are located between the source region SR and the drain region DR.

Here, each of a pair of the semiconductor regions, that is comprising one memory cell and sandwiching the control gate electrode CG, and that is the memory gate electrode MG in plan view, may function as a source region or a drain region depending on the operation of the memory cell. Therefore, here, the semiconductor region (diffusion region) on the memory gate electrode MG side is defined as a source region, and the semiconductor region (diffusion region) on the control gate electrode CG side is defined as a drain region.

As shown in FIG. 1, a pair of control gate electrodes CG and memory gate electrodes MG adjacent to each other are arranged in line symmetry in the X direction with respect to another pair of control gate electrodes CG and memory gate electrodes MG. That is, the memory gate electrode MG is not arranged between the control gate electrodes CG adjacent to each other, and the drain region DR is formed in each of the fins F1 to F4 and the fins FD1 to FD4 between the control gate electrodes CG. Further, the control gate electrode CG is not arranged between the memory gate electrodes MG adjacent to each other, and the source region SR is formed in each of the fins F1 to F4 and the fins FD1 to FD4 between the memory gate electrodes MG.

One plug (drain contact plug, conductive connecting portion) DC is electrically connected with the drain region DR of each of the fins F1, FD1 and F2. One plug DC is electrically connected with each of the drain region DR of the fins F3, FD3 and F4. That is, one plug DC is electrically connected to the drain region DR of each of the fins F1, FD1 and F2, and the plug DC overlaps with the fins F1, FD1, and F2 in plan view. Similarly, another plug DC is electrically connected to the drain region DR of each of the fins F3, FD3 and F4, and the another plug DC overlaps with the fins F3, FD3 and F4 in plan view.

On the other hand, the plugs DC is not connected with the drain region DR of each of the fins FD2 and FD4. That is, the plurality of plugs DC is spaced apart from each of the fins FD2 and FD4 in plan view. In other words, each of the fins FD2 and FD4 is arranged between the plugs DC lined up in the Y direction in plan view. Therefore, the fins FD2 and FD4 and the plug DC are insulated from each other.

One plug SC is connected to the source region SR of each of the fin F1 and the two fins (not shown). One plug SC is connected to each of the source regions SR of the fins F2, FD2, and F3. One plug SC is connected to each of the source region regions SR of the fins F4, FD4, and fins FD4 and the source regions SR of the fins SR are adjacent to each other. That is, one plug SC is electrically connected to each of the source region SR of the fin F1 and the two fins of the region not shown, and the plug SC overlaps the fin F1 and the two fins in plan view. One plug SC is electrically connected to the source region SR of each of the fins F2, FD2, and F3, and the plug SC overlaps with the fins F2, FD2, and F3 in plan view. Similarly, another plug SC is electrically connected to the source region SR of each of the fins (not shown) adjacent to the fins F4, FD4, and fin FD4, and the plug SC overlaps the fins (not shown) adjacent to the fins F4, FD4, and fin FD4 in plan view.

On the other hand, the plugs SC is not connected with the source region SR of each of the fins FD1 and FD3 shown in FIG. 5. That is, the plurality of plugs SC is spaced apart from each of the fins FD1 and FD3 in plan view. In other words, each of the fins FD1 and FD3 is arranged between the plugs SC lined up in the Y direction in plan view. Therefore, the fins FD1 and FD3 and the plug SC are insulated from each other.

In this manner, a plurality of plugs DC and SC are arranged side by side in the Y direction. The plugs DC and the plugs SC lined up in the X direction are arranged at positions shifted by a half cycle in the Y direction. That is, the plugs DC and SC are arranged in a staggered manner. Therefore, of the plurality of fins connected to one plug DC, a plug SC is connected to some of the fins, and another plug SC is connected to some of the other fins. Similarly, among a plurality of fins connected to one plug SC, a plug DC is connected to some of the fins, and another plug DC is connected to some of the other fins. That is, a separate plug SC is connected to each of the first fin connected to one end of the plug DC in the Y direction and the second fin connected to the other end of the plug DC in the Y direction. Similarly, a separate plug DC is connected to each of the second fin connected to one end of the plug SC in the Y direction and the third fin connected to the other end of the plug SC in the Y direction.

Here, it is assumed that there is no fin FD1 to FD4 in which the channel is not formed, and which does not affect the operation of semiconductor device. In that case, in FIG. 1, each of the fins F1 to F4 comprising any of the memory cells MC1 to MC8 can be regarded as a first fin, a second fin, a third fin and a fourth fin, which are lined up in the Y direction. At this time, the first plug DC of the plurality of plugs DC lined up in the Y direction is electrically connected with each of the first fin and the second fin. In addition, focusing only on the plug SC whose entirety is shown in FIG. 1, the first plug SC of the plurality of plugs SC lined up in the Y direction is electrically connected with each of the second fin and the third fin. The second plug DC of the plurality of plugs DC lined up in the Y direction is electrically connected with each of the third fin and the fourth fin.

That is, the N-th plug DC lined up in the Y direction is coupled with (2N−1)-th and 2N-th fins, and the N-th plug SC lined up in the Y direction is coupled with 2N-th and (2N+1)-th fins. That is, the N-th plug DC of the plurality of plugs DC lined up in the Y direction is electrically connected with the drain region DR formed in each of the (2N−1)-th fin (protruding portion) of the plurality of fins (protruding portions) and the 2N-th fin (protruding portion) of the plurality of fins (protruding portions), which are lined up in the Y direction. Also, the N-th plug SC of the plurality of plugs SC lined up in the Y direction is electrically connected with the source region SR formed in each of the 2N-th fin (protruding portion) of the plurality of fins (protruding portions) and the (2N+1)-th fin (protruding portion) of the plurality of fins (protruding portions), which are lined up in the Y direction.

Here, focusing on the presence of the dummy fins FD1 to FD4, among the plugs DC lined up in the Y direction, the N-th plug DC is electrically connected with the fin FD1 between the (2N−1)-th fin F1 and the 2N-th fin F2 in the Y direction. Also, the N-th plug SC of the plurality of plugs SC lined up in the Y direction, is electrically connected to the fin FD2 between the 2N-th fin F2 and the (2N+1)-th fin F3 in the Y direction.

The memory cell MC1 is a non-volatile storage element having a control gate electrode CG and a memory gate electrode MG, and a drain region DR and a source region SR formed in the fin F1. The memory cell MC2 is a non-volatile storage element having a control gate electrode CG and a memory gate electrode MG, and a drain region DR and a source region SR formed in the fin F2. The memory cell MC3 is a non-volatile storage element having a control gate electrode CG and a memory gate electrode MG, and a drain region DR and a source region SR formed in the fin F3. The memory cell MC4 is a non-volatile memory device having a control gate electrode CG and a memory gate electrode MG, and a drain region DR and a source region SR formed in the fin F4. Hereinafter, the source region SR and the drain region DR comprising one memory cell may be referred to as a source/drain region.

FIG. 1 shows memory cells MC5 to MC8 each having a control gate electrode CG and a memory gate electrode MG that differ from the foregoing control gate electrode CG and the foregoing memory gate electrode MG. The memory cell MC5 includes a source/drain region formed in the fin F1, the memory cell MC6 includes a source/drain region formed in the fin F2, the memory cell MC7 includes a source/drain region formed in the fin F3, and the memory cell MC8 includes a source/drain region formed in the fin F4. That is, the memory cells MC1 and MC5 are formed on the fin F1, the memory cells MC2 and MC6 are formed on the fin F2, the memory cells MC3 and MC7 are formed on the fin F3, and the memory cells MC4 and MC8 are formed on the fin F4.

The memory cell MC1 to MC4 and the memory cell MC5 to MC8 are symmetrical in the X direction about a line passing through the center of the plugs SC in the X direction. That is, the memory cells MC1, MC5 share one source region SR with each other. This is also true between the memory cells MC2 and MC6, between the memory cells MC3 and MC7, and between the memory cells MC4 and MC8. In addition, other memory cells (not shown) arranged next to the memory cell MC1 via the plug DC in the X direction have a line-symmetric configuration with respect to the memory cells MC1, and the above memory cell and the memory cell MC1 share one drain area.

The memory cells MC1 to MC8 are connected to different combinations of plugs DC and SC. That is, only one memory cell is connected to the predetermined plug DC and the predetermined plug SC. Different electrical potentials can be simultaneously supplied to the plugs DC lined up in the Y direction. In addition, different electrical potentials (voltages) can be simultaneously supplied (applied) to N-th plug SC of the plurality of plugs SC and (N+1)-th plug SC of the plurality of plugs SC, which are lined up in the Y direction. That is, a plurality of plugs SC lined up in the Y direction are alternately connected to different source lines, as shown in FIG. 6. That is, the electrical potential of the N-th plug SC of the plurality of plugs SC lined up in the Y direction and the electrical potential of the (N+1)-th plug SC of the plurality of plugs SC lined up in the Y direction can be controlled separately.

Thus, any memory cell can be selected from the memory cells MC1 to MC8 and a desired operation can be performed. That is, the operation of each memory cell MC1 to MC8 can be controlled separately. In other words, the operation of the memory cell MC1 including the pair of source regions SR and drain regions DR formed in the (2N−1)-th fin F1 among the plurality of fins lined up in the Y direction (excluding the dummy fins) and the operation of the memory cell MC2 including the pair of source regions SR and drain regions DR formed in the 2N-th fin F2 among the plurality of fins lined up in the Y direction can be controlled separately. Therefore, a region necessary for forming a 1-bit memory cell is a rectangular region surrounded by a broken line in FIG. 1, and the region falls within a range from the center of the plug SC to the middle of the plugs SC adjacent to each other in the Y direction.

The distance (width) in the X direction of the region is the distance between the centers of each of the plugs DC and SC sandwiching the pair of control gate electrode CG and memory gate electrode MG in the X direction. The distance (width, cell pitch) of the region in the Y direction is about 1.5 times the distance Ly. The distance Ly is a distance between the plugs DC adjacent to each other in the Y direction, and is a distance between the plugs SC adjacent to each other in the Y direction. Here, since a plurality of fins lined up in the Y direction is arranged at equal intervals, the length of the plug DC in the Y direction and the length of the plug SC in the Y direction are respectively determined by the distance between the plugs DC adjacent to each other in the Y direction and the distance between the plugs SC adjacent to each other in the Y direction. Specifically, the length of each of the plugs DC and SC in the Y direction is about twice the distance Ly. Therefore, as described above, the distance of the region in the Y direction is 1.5×Ly. That is, when the memory cell array is formed with reference to the distance Ly which is the width of the plug DC or SC, the cell pitch in the Y direction is 1.5×Ly. This is also true when the dummy fin FD1 to FD4 is not formed (see FIG. 7), as will be described later as modified example of present embodiment. The cell size referred to in the present application is the size (area) of a region necessary for forming a 1-bit memory cell, and the cell pitch referred to in the present application is the width of the region.

Although not described in the present embodiment, the semiconductor chip according to the present embodiment has a logic circuit region in addition to a memory cell region in which the memory cell array is formed. The logic circuit area includes a plurality of fin-type MISFET (Metal Insulator Semiconductor Field Effect Transistor, MIS-type field effect transistors) comprising the logic circuit. In the logic circuit area, a plurality of fins on which MISFET is formed is arranged at equal intervals in the transverse direction of each fin, for example, at the shortest distance that can be formed. In the memory cell region, dummy fins FD1 to FD4 are formed in order to match the arrangement of the fins in the logic circuit region, thereby realizing simplification of the manufacturing process of the semiconductor device and improvement of reliability. In addition, since the dummy fins FD1 to FD4 are formed, the fins are formed densely. Thus, a defect such as local excessive dishing can be prevented from occurring.

In a region (memory cell array) in which a plurality of memory cells are arranged in an array shape in the X direction and the Y direction, a structure of memory cells for one bit surrounded by a broken line is repeatedly lined up in the X direction and the Y direction. However, the memory cells adjacent to each other in the X direction or the Y direction have a layout which is line symmetric with respect to each other in plan view with one side of a rectangular formed by a broken line in FIG. 1 as an axis.

FIG. 3 shows a cross sectional including the control gate electrode CG, the memory gate electrode MG, the plugs DC and SC along the longitudinal direction of the fin F2 and a cross section including the memory gate electrode MG along the lateral direction of the fin F2 in this order from the left to the right. FIG. 4 shows a cross section including the plugs SC along the lateral directions of the fins F2 to F4 and the fins FD1 to FD4, respectively.

As shown in FIGS. 2 to 5, the control gate electrode CG and the memory gate electrode MG extend in the Y direction so as to straddle a plurality of fins including the fin F2. It is conceivable that upper surface of each of the control gate electrode CG and the memory gate electrode MG is covered with a silicide layer, but the silicide layer is not shown here. The silicide layer is comprised of, for example, nickel silicide (NiSi). The fin F2 will be described below, but the other fins have the same structure as the fin F2. Although the memory cell MC2 will be mainly described below, the other memory cells have the same structures as the memory cell MC2.

The lower portion of the side surface of the fin F2 is surrounded by the device isolation film EI formed on upper surface of semiconductor substrate SB. That is, the fins are separated from each other by the element isolation film EI.

In the fin F2, p-type wells PW, which are p-type semiconductor regions, are formed from upper surface of the fin F2 to the lower portion of the fin F2.

The fin F2 is, for example, a protruding portion of a rectangular parallelepiped shape, which is protruded from the upper surface of the semiconductor substrate SB in a vertical direction against the upper surface. However, the fin F2 does not necessarily have to be a rectangular parallelepiped, and the corner portion of the rectangle may be rounded in the cross-sectional view in the lateral direction. Also, the side of the fin F2 may be perpendicular to the upper surface of the semiconductor substrate SB, but may have angles of inclination close to perpendicular. That is, a cross-sectional shape of the fin F2 is a rectangular parallelepiped or a trapezoid.

The control gate electrode CG is formed on upper surface and the side surface of the fin F2 via the gate insulating film GF, and the memory gate electrode MG is formed in an area adjacent to the control gate electrode CG via the insulating film C1 in the longitudinal direction (X direction) of the fin F2. An insulating film C1 is interposed between the control gate electrode CG and the memory gate electrode MG, and the control gate electrode CG and the memory gate electrode MG are electrically isolated by the insulating film C1. An insulating film C1 is interposed between the memory gate electrodes MG and the upper surface of the fin F2. The insulating film C1 is continuously formed so as to cover the side surface and the bottom surface of the memory gate electrode MG. Therefore, the insulating film C1 has an L-shaped cross-sectional shape. The control gate electrodes CG and the memory gate electrodes MG cover upper surface and the side surfaces of the fin F2.

The gate insulating film GF is a thermal oxide film (silicon oxide film) formed by thermally oxidizing the upper surface and the side surface of the fin F2, which is a protruding portion of the semiconductor substrate SB comprised of silicon, and the thickness of the gate insulating film GF is, for example, 2 nm. The insulating film C1 includes a silicon oxide film X1 comprised of a thermal oxide film having a thickness of 4 nm formed by thermally oxidizing upper surface and the side surfaces of the fin F2, a silicon nitride film NF formed on the silicon oxide film X1, and a silicon oxide film X2 formed on the silicon nitride film NF. The silicon nitride film NF is a charge storage portion (charge storage layer, charge storage layer) of the memory cell MC2. The silicon nitride film has a thickness of 7 nm, for example, and the silicon oxide film X2 has a thickness of 9 nm, for example.

That is, the insulating film C1 has a stacked-layer structure composed of a silicon oxide film X1, a silicon nitride film NF, and a silicon oxide film X2 stacked in this order from upper surface side of the fin F2 and the side surfaces of the control gate electrodes CG. The thickness of the insulating film C1 is, for example, 20 nm, and is larger than the thickness of the gate insulating film GF under the control gate electrode CG. The silicon oxide film X2 may be formed of a silicon oxynitride film.

In the lateral direction (Y direction) of the fin F2, the control gate electrodes CG extend through the gate insulating film GF along upper surface of the fin F2, the side surfaces of the fin F2, and upper surface of the device isolation film EI. Similarly, in the lateral direction of the fin F2, the memory gate electrode MG extends along upper surface and the side surface of the fin F2 and upper surface of the device isolation film EI through the insulating film C1.

The side surfaces of the pattern including the control gate electrode CG, the memory gate electrode MG, the gate insulating film GF, and the insulating film C1 are covered with the sidewall spacers SW. The sidewall spacer SW has, for example, a stacked structure of a silicon nitride film and a silicon oxide film.

A source region SR and a drain region DR are formed from the surface of the fin F2 to the inside of the fin F2 so as to sandwich the fin F2 immediately below the pattern including the control gate electrode CG. The source region SR is composed of a diffusion region DS which is a n+ type semiconductor region, and the drain region DR is composed of an extension region EX which is a n− type semiconductor region and a diffusion region DD which is a n+ type semiconductor region. The impurity concentrations of the diffusion regions DD and DS are higher than those of the extension region EX. The depth of the extension region EX is deeper than the diffusion regions DD and DS. The depth of the extension region EX may be shallower or deeper than the diffusion regions DD and DS, but in either case, the end portion of the extension region EX is located on the fin F2 side immediately below the diffusion region DD, that is, on the channel region side. The extension region EX and the diffusion region DD are in contact with each other.

As described above, by forming the drain region DR having the structure including the extension region EX having a low impurity concentration and the diffused region DD having a high impurity concentration, that is, the LDD (Lightly Doped Drain) structure, the short-channel characteristics of MISFET having the drain region DR can be improved.

An interlayer insulating film IL1 comprised of, for example, a silicon oxide film is formed on the fin F2 and the device isolation film EI.

The upper surface and a part of the side surface of the fin F2 in which the diffusion region DS comprising a source region SR is formed is continuously covered with an epitaxial layer (epitaxial growth layer, semiconductor layer) EPS. Also, the upper surface and a part of the side surface of the fin F2 in which the diffusion region DD comprising a drain region DR is formed is continuously covered with an epitaxial layer (epitaxial growth layer, semiconductor layer) EPD. Like each of the plurality of plugs DC and SC, each of the plurality of epitaxial layers EPD and the plurality of epitaxial layers EPS is arranged side by side in the Y direction. Each epitaxial layer EPD and EPS is an epitaxial layer formed by connecting the semiconductor layers to each other, which are grown from a surface of each fin by an epitaxial growth method, and which are grown from the fins arranged next to each other in the Y direction.

That is, as shown in FIG. 4, one epitaxial layer EPS is formed in contact with, for example, the fins F2, FD2 and F3, and the other epitaxial layer EPS is in contact with, for example, the fins F4 and FD4, but none of the epitaxial layer EPS is in contact with the fin FD3 between the fins F3 and F4. This is because after the interlayer insulating film IL1 is formed on the fins on which the epitaxial layer is not formed, upper surface of the interlayer insulating film IL1 is selectively etched back so as to expose the upper end of a part of the epitaxial layer, and then the epitaxial layer EPS is formed using the epitaxial growth method. That is, since the fin FD3 is not exposed in the etch-back process and the epitaxial layer EPS is formed while the fin FD3 is protected by the interlayer insulating film IL', the fin FD3 is spaced apart from the epitaxial layer EPS. The epitaxial layer EPD is also formed in the same manner as the epitaxial layer EPS. Therefore, each of the epitaxial layers EPS and EPD is formed inside of a trench formed in the upper surface of the interlayer insulating film IL1. An interlayer insulating film IL2 comprised of, for example, a silicon oxide film is buried in each of the epitaxial layers EPS and EPD in the trench. The upper surface of each of the interlayer insulating films IL1 and IL2 is planarized in substantially the same plane.

Each of the epitaxial layers EPS and EPD is comprised of, for example, SiP (silicon phosphide) or SiC (silicon carbide). Each of the epitaxial layers EPS and EPD is a semiconductor layer grown from the surface of each fin, and has a rhombic shape in a cross section along the Y direction (see FIG. 4) as grown and in contact with each other to be integrated.

Each of the epitaxial layers EPS and EPD is a semiconductor layer into which an n-type impurity (e.g., P (phosphorus) or As (arsenic)) is introduced. Also, the epitaxial layer EPS composes a source region SR, and the epitaxial layer EPD composes a drain region DR.

The plug SC extending in the Y direction is connected with the upper surface of the epitaxial layer EPS. Plugs DC extending in the Y direction are connected to upper surface of the epitaxial layers EPD. However, a silicide layer (not shown) may be interposed between the plug SC and the epitaxial layer EPS, and between the plug DC and the epitaxial layer EPD. The silicide layer has a function of reducing the connection resistance between the plug DC or SC, which is a connection portion, for example, made of a metal film mainly containing tungsten (W), and the epitaxial layer EPD or EPS comprised of a semiconductor. The epitaxial layers EPD and EPS have a function of reducing parasitic resistance between the fin and each plugs DC and SC. The epitaxial layer EPD has a structure similar to that of the epitaxial layer EPS shown in FIG. 4. However, the epitaxial layer EPS is formed at a position overlapping with the plug SC shown in FIG. 1 in plan view, and the epitaxial layer EPD is formed at a position overlapping with the plug DC shown in FIG. 1 in plan view.

Therefore, while all the epitaxial layers EPS are not connected to the fin FD3, one epitaxial layer EPD is connected to the fins F3 and F4 on both sides of the fin FD3 and the fin FD3 in the Y direction, and all the epitaxial layers EPD are not connected to the fin FD2, FD4 shown in FIG. 1. That is, of the two epitaxial layers EPD lined up in the Y direction, one epitaxial layer EPD is in contact with the fins F1, FD1 and F2, and the other epitaxial layer EPD is in contact with the fins F3, FD3 and F4.

In other words, the N-th epitaxial layer (semiconductor layer) EPD of the plurality of epitaxial layers (semiconductor layers) EPD lined up in the Y direction is in contact with each of the upper surface of the drain region DR formed in each of the (2N−1)-th fin (protruding portion) of the plurality of fin (protruding portions) and the 2N-th fin (protruding portion) of the plurality of fins (protruding portions), which are lined up in the Y direction, and the side surface of the drain region DR formed in each of the (2N−1)-th fin (protruding portion) of the plurality of fins (protruding portions) and the 2N-th fin (protruding portion) of the plurality of fins (protruding portions), which are lined up in the Y direction. Also, the N-th epitaxial layer (semiconductor layer) EPS of the plurality of epitaxial layers (semiconductor layers) EPS lined up in the Y direction is in contact with each of the upper surface of the source region SR formed in each of the 2N-th fin (protruding portion) of the plurality of fins (protruding portions) and the (2N+1)-th fins (protruding portion) of the plurality of fins (protruding portions), which are lined up in the Y direction, and the side surface of the source region SR formed in each of the 2N-th fin (protruding portion) of the plurality of fins (protruding portions) and the (2N+1)-th fin (protruding portion) of the plurality of fins (protruding portions), which are lined up in Y second direction.

The plug DC is electrically connected with the drain region (semiconductor region) DR formed in the fin via the epitaxial layer (semiconductor layer) EPD, and the plug SC is electrically connected with the source region (semiconductor region) SR formed in the fin via the epitaxial layer (semiconductor layer) EPS. Therefore, each of the plugs DC and SC does not need to overlap with all of the three fins lined up in the Y direction in plan view. Each of the plugs DC and SC is buried in a contact hole opened in the interlayer insulating film IL2.

The memory cell MC2 shown in FIG. 3 has a control gate electrode CG and a memory gate electrode MG, and a drain region DR and a source region SR, which are formed in the fin F2 so as to sandwich the control gate electrode CG and the memory gate electrode MG. The control gate electrode CG, the drain region DR and the source region SR composes a control transistor, the memory gate electrode MG, the drain region DR and the source region SR composes a memory transistor, further the control transistor and the memory transistor composes a memory cell MC2. That is, the control transistor and the memory transistor share the source/drain region.

Each of the control transistor and the memory transistor is a fin-type field effect transistor (FINFET) having a side surface and an upper surface of the fin F2 as a channel region. The distance between the drain region DR and the source region SR in the gate length direction (X direction) of each of the control gate electrode CG and the memory gate electrode MG corresponds to the channel length of the memory cell MC2. When the transistor comprising the memory cell MC2 is in the ON-state, the channel is formed on the upper surface and the side surfaces of the fin F2.

A plurality of wirings M1 are formed on the interlayer insulating film IL2, and the wirings M1 are electrically connected to the drain region DR or the source region SR of the memory cell MC2 via the plugs DC or SC. Although not shown in the figure, a multilayer wiring layer in which a plurality of wirings and an interlayer insulating film are stacked is formed on the wiring M1.

FIG. 6 shows source lines SL1 to SL4, bit lines BL1, and bit lines BL2 on fins F1 to F4 and FD0 to FD4, respectively. However, although a lower wiring may be formed between the plug DC and the bit line BL1 to BL2, or between the plug SC and the source line SL1 to SL4, the lower wiring is not shown in FIG. 6. FIG. 6 also shows a memory cell MC9 to MC16 having a line-symmetric layout with respect to the memory cell MC1 to MC8 in the X direction. Here, it is assumed that the interconnection M1 shown in FIG. 3 is disposed below the source line SL1 to SL4, the bit line BL1 to BL2 shown in FIG. 6. Note that the wiring M1 may constitute one of a bit line and a source line. The source line SL1 to SL4 and the bit line BL1 to BL2 are not formed at the same height, and one of the source line and the bit line is located on the other. In FIG. 6, the outlines of the bit line BL1, BL2 and the other patterns are shown even in a portion where the bit line BL1, BL2 and the other patterns overlap each other in plan view.

As shown in FIG. 6, the bit lines BL1, BL2 extend in the X direction and are aligned in the Y direction. The source lines SL1 to SL4 extend in the Y direction and are aligned in the X direction with each other. The bit line BL1 is electrically connected to the respective drain regions DR of the memory cells MC1, MC2, MC5, MC6, MC9, MC10, MC13 and MC14 through the plugs DC. The bit line BL2 is electrically connected to the respective drain regions DR of the memory cells MC3, MC4, MC7, MC8, MC11, MC12, MC15 and MC16 through the plugs DC. The source line SL1 is electrically connected to the source regions SR of the memory cells MC1, MC4, MC5 and SR of the memory cells MC8. The source line SL2 is electrically connected to the source regions SR of the memory cells MC2, MC3, MC6 and SR of the memory cells MC7. The source line SL3 is electrically connected to the source regions SR of the memory cells MC9, MC12, MC13 and SR of the memory cells MC16. The source line SL4 is electrically connected to the source regions SR of the memory cells MC10, MC11, MC14 and SR of the memory cells MC15.

As described above, different source lines are alternately connected to the plugs SC lined up in the Y direction. Thus, any memory cell can be selected from the memory cells MC1 to MC16 and a desired operation can be performed. While each of the bit lines BL1 to BL2 extends directly above the plug DC, the source line SL1 to SL4 does not extend directly above the plug SC, and a portion protruding in the X direction from the source line SL1 to SL4 overlaps with the plug SC in plan view.

<Operation of Non-Volatile Memory>

Next, an operation example of the non-volatile memory will be described with reference to FIG. 8.

FIG. 8 is a table showing an example of a condition for applying a voltage to each portion of the selected memory cell at the time of "WRITE", "ERASE" and "READ". In the table of FIG. 8, the voltage Vmg applied to the memory gate electrode MG of the memory cell MC2 (selected memory cell) shown in FIG. 3, the voltage Vs applied to the source region SR, the voltage Vcg applied to the control gate electrode CG, the voltage Vd applied to the drain region DR, and the voltage Vb applied to the p-type well PW are described in each of the "WRITE", "ERASE", and "READ" states. Note that what is shown in the table of FIG. 8 is a suitable example of the voltage application condition, and is not limited to this, and can be variously changed as necessary. Further, in present embodiment, implantation of electrons into the silicon nitride film NF, which is the charge storage portion of the memory transistor, is defined as "WRITE" and injection of holes into the silicon nitride film NF is defined as "ERASE".

As the writing system, a writing method (hot electron injection writing method) in which writing is performed by hot electron injection by source side injection, which is called a so-called SSI (Source Side Injection) method, can be used. For example, writing is performed by applying a voltage as shown in the column of "WRITE" in FIG. 8 to each portion of the selected memory cell in which writing is performed, and injecting electrons into the silicon nitride film NF of the insulating film C1 of the selected memory cell.

In the write operation, for example, 1.5 V is applied to the drain region DR, and 6 V is applied to the source region SR. Therefore, the current flows from the source region SR (on the memory gate electrode MG side) to the drain region DR (on the control gate electrode CG side). The carriers (electrons) flow from the drain region DR (on the control gate electrode CG side) to the source region SR (on the memory gate electrode MG side). That is, here, the semiconductor region (drain region DR) on the control gate electrode CG side functions as a source, and the semiconductor region (source region SR) on the memory gate electrode MG side functions as a drain.

At this time, a hot electron is generated in a channel region (between the source and drain regions) located between two gate electrodes (memory gate electrode MG and control gate electrode CG) in a plan view, and the hot electron is injected into the silicon nitride film NF which is a charge storage portion in the insulating film C1 under the memory gate electrode MG. The injected hot electrons are captured by the trap level in the silicon nitride film NF of the insulating film C1, and as a result, the threshold voltage of the memory transistor rises. That is, the memory transistor is in a write-state.

As an erasing method, an erasing method (hot hole injection erasing method) in which erasing is performed by hot hole injection by BTBT (Band-To-Band Tunneling (band-to-band tunneling) called a so-called BTBT method can be used. That is, erasing is performed by injecting holes generated by BTBT (Band-To-Band Tunneling) into the charge-storage portion (silicon nitride film NF in insulating film C1). For example, a voltage as shown in the column of "ERASE" in FIG. 8 is applied to the respective portions of the selected memory cell to be erased, holes are generated by BTBT phenomena and accelerated by electric field to inject holes into the silicon nitride film NF of the insulating film C1 of the selected memory cell, thereby lowering the threshold voltage of the memory transistor. That is, the memory transistor is in an erase-state.

At the time of reading, for example, a voltage as shown in the column of "READ" in FIG. 8 is applied to each portion of the selected memory cell to be read. By setting the voltage Vmg applied to the memory gate electrode MG at the time of reading to a value between the threshold voltage of the memory transistor in the write state and the threshold voltage of the memory transistor in the erase state, it is possible to identify between the write-state and the erase-state.

In the read operation, for example, 1.5 V is applied to the drain region DR, and 0 V is applied to the source region SR. Therefore, the current flows from the drain region DR (on the side of the control gate electrode CG) to the source region SR (on the side of the memory gate electrode MG). The carriers (electrons) flow from the source region SR (on the memory gate electrode MG side) to the drain region DR (on the control gate electrode CG side). That is, the role of the source and the drain are interchanged between the source region SR and the drain region DR in the write operation.

<Effect of Semiconductor Device>

Figure 9:
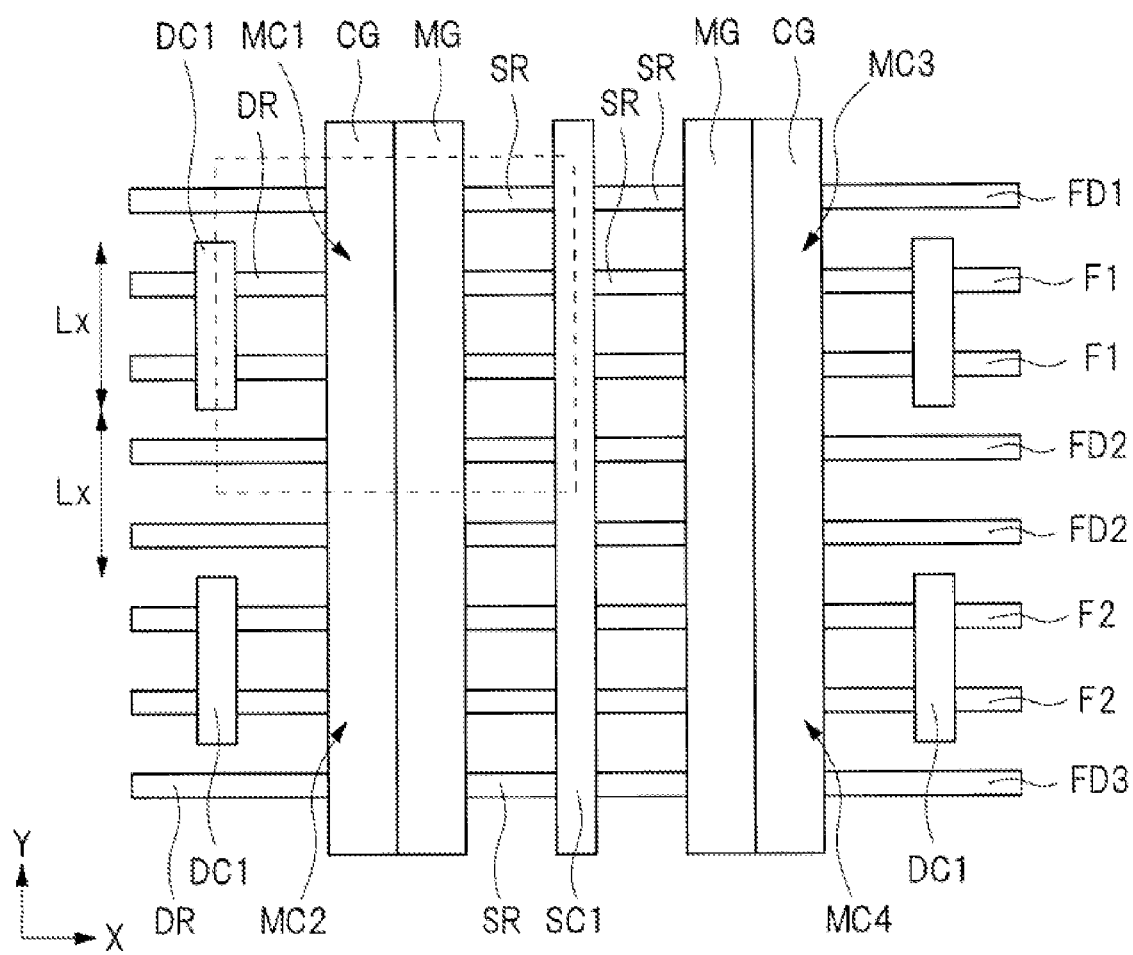
FIG. 9 is a plan view of a semiconductor device according to a comparative example reviewed by the inventor.

FIG. 9 is a plan view of a semiconductor device of a comparative example studied by the present inventor. In the memory cell array of present embodiment shown in FIG. 1, one plug SC is connected to only two memory cells, and one plug SC is not connected to three or more memory cells. On the other hand, in the planar layout of the memory cell array shown in FIG. 9, unlike the planar layout shown in FIG. 1, one plug (source contact plug) SC1 connected to the source regions of the memory cells MC1 to MC4 extends in the Y direction, and three or more memory cells lined up in the Y direction are connected to each other.

As shown in FIG. 9, in the memory cell array, fins FD1, F1, F1, FD2, FD2, F2, F2 and FD3 are arranged in order in the Y direction. Each of the fins FD1, FD2 and FD3 has a source/drain region, but since the plug DC1 is not connected. Therefore, since no channel is formed, no memory cell is comprised. Each of the fins F1, F2 and F3 has a source/drain region, and both of the plugs DC1 and SC1 are coupled thereto. Therefore, the source region SR and the drain region DR, which are formed in each of the fins F1, F2 and F3, compose a memory cell.

Here, the plug SC1 is connected with each of the two fins F1 connected with one plug DC1. That is, since it is impossible to apply different drain voltages or source voltages to the foregoing two fins F1 arranged next to each other in the Y direction, the foregoing two fins F1 operate as one memory cell MC1. Therefore, a region of the memory cell array which is necessary for forming a memory cell of 1-bit is a region surrounded by a broken line shown in FIG. 9. The distance (width, cell pitch) in the Y direction of the region is, for example, a distance from the middle of two fins FD1 arranged next to each other to the middle of two fins FD2 arranged next to each other.

The plugs DC1 of the comparative examples have distances Lx from one end in the Y direction to the other end in the Y direction. The distance Lx is a minimum length at which the plug DC1 is formed, and when a plurality of fins is arranged at equal intervals in the Y direction at a minimum interval, the plug DC1 needs to overlap the two fins in plan view. In this instance, the distance between the plugs DC1 lined up in the Y direction is the same distance Lx as the length of the plug DC1 in the Y direction. This is the same even when the dummy fin FD1, FD2 and the dummy fin FD3 are not formed, or when only one fin is formed directly under the plug DC1. As a result, the width in the Y direction of the region required to form a memory cell of 1 bit is 2×Lx. That is, in the comparative embodiment, since the memory cell array is formed with reference to the distances Lx between the plugs DC1, the cell pitch in the Y direction is 2×Lx. In the configuration shown in FIG. 9, two of dummy fins FD1, FD2 or FD3, which are not connected with the plug DC1, are arranged side by side between the plugs DC1 arranged next to each other in the Y direction.

Here, in order to reduce a parasitic resistance between the fin and the plug DC1, an epitaxial layer (not shown) is grown on the fin so as to extend in the Y direction. Therefore, the distance between the plugs DC1 arranged next to each other in the Y direction need to be wide. In the semiconductor device of comparative example, since the length of the plug DC1 in the Y direction is formed to be the shortest, the distance between the plugs DC1 is the distance Lx, and one plug SC1 is connected with all of the fins connected with each of the plugs DC1 lined up in the Y direction. In this instance, a memory cell which can be controlled separately cannot be formed in each of a plurality of fins connected to one plugging DC1. On the other hand, even if only one fin is formed immediately below the plug DC1, the cell size cannot be reduced. Therefore, in the comparative example, there arises a problem that the cell size becomes large.

Therefore, in present embodiment, as shown in FIG. 1, a plurality of plugs DC periodically lined up in the Y direction and a plurality of plugs SC periodically lined up in the Y direction are formed, and the plugs SC are arranged at positions shifted by a half cycle with respect to the plugs DC in the Y direction. Here, for example, since different plugs SC are respectively connected with the fins F1 and F2 connected with one plug DC1, the operation of the memory cell MC1 on the fin F1 and the operation of the memory cell MC2 on the fin F2 can be controlled separately. Therefore, the cell size of the memory cell for one bit can be reduced.

Specifically, since the distance Lx (refer to FIG. 9) of the comparative example is, for example, 60 nm, and the distance Ly (see FIG. 1) of present embodiment is, for example, 50 nm, in present embodiment in which the cell pitch in the Y direction is 1.5×Ly, the cell size can be reduced to 63% as compared with the comparative example in which the cell pitch in the Y direction is 2×Lx.

As described above, in semiconductor device of present embodiment, semiconductor device can be miniaturized and further integrated by reducing the cell size of the memory cell. Therefore, the performance of semiconductor device can be improved.

Modified Example

Figure 7:
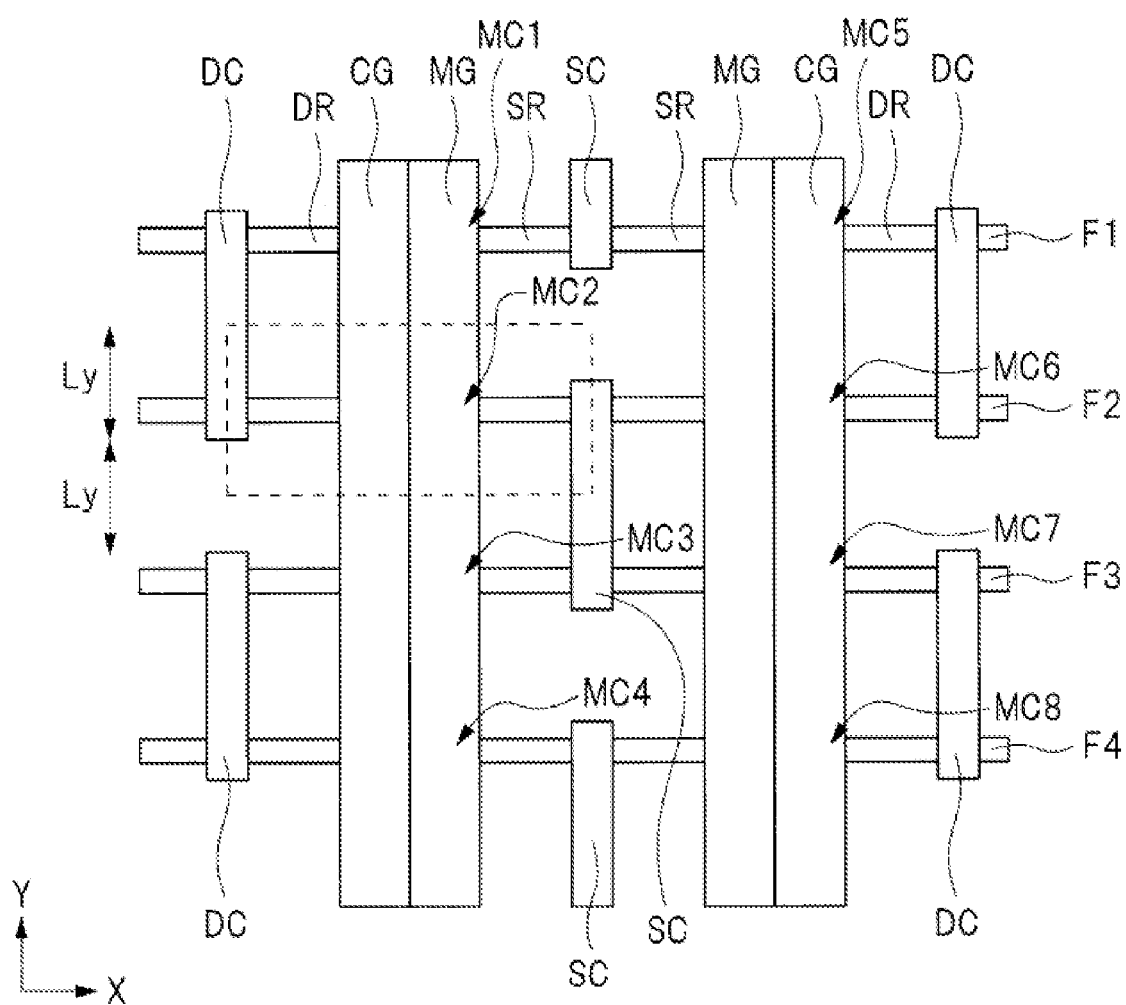
FIG. 7 is a plan view of a semiconductor device according to a modified example of the present application.

As shown in FIG. 7, dummy fins may not be formed. FIG. 7 is a plan view showing semiconductor device of present embodiment.

In the memory cell array shown in FIG. 7, fins F1, F2, F3 and F4 are arranged in this order in the Y direction. The structure of the present modified example is the same as the structure described with reference to FIGS. 1 to 6 except that the dummy fin FD1 to FD4 (see FIG. 1) is not formed.

Specifically, each of the plugs DC and SC is connected to only two fins. Further, no fin is arranged between the plugs DC arranged next to each other in the Y direction and between the plugs SC arranged next to each other in the Y direction in plan view.

Even when the dummy fins are not arranged as in the present modified example, the cell size of the memory cell for one bit can be reduced in the same manner as in semiconductor device described with reference to FIGS. 1 to 6. This can improve the performance of semiconductor device.

Although the invention made by the present inventor has been specifically described based on the embodiment, the present invention is not limited to the as described above embodiment, and it is needless to say that various modifications can be made without departing from the gist thereof.

What is claimed is:
1. A semiconductor device comprising:
a semiconductor substrate;
a plurality of first protruding portions each protruded from an upper surface of the semiconductor substrate and each extended in a first direction along the upper surface of the semiconductor substrate, each of the plurality of first protruding portions being a part of the semiconductor substrate;
a first gate electrode formed on each of an upper surface of each of the plurality of first protruding portions and a side surface of each of the plurality of first protruding portions via a first insulating film, and extended in a second direction crossing to the first direction;
a second gate electrode formed on each of the upper surface of each of the plurality of first protruding portions and the side surface of each of the plurality of first protruding portions via a second insulating film, which is a charge storage portion, and extended in the second direction, the second gate electrode being adjacent to one of side surfaces of the first gate electrode via an insulating film;
a first semiconductor region formed in each of the plurality of first protruding portions so as to arranged next to the first gate electrode in plan view;
a second semiconductor region formed in each of the plurality of first protruding portions so as to arranged next to the second gate electrode in plan view;
a plurality of first plugs formed on the plurality of first protruding portions, respectively, and lined up in the second direction; and
a plurality of second plugs formed on the plurality of first protruding portions, respectively, and lined up in the second direction,
wherein the first gate electrode, the second gate electrode, the first semiconductor region and the second semiconductor region compose a non-volatile storage element, wherein a N-th plug of the plurality of first plugs lined up in the second direction is electrically connected with the first semiconductor region formed in each of a (2N−1)-th protruding portion of the plurality of first protruding portions and a 2N-th protruding portion of the plurality of first protruding portions, which are lined up in the second direction, and wherein a N-th plug of the plurality of second plugs lined up in the second direction is electrically connected with the second semiconductor region formed in each of a 2N-th protruding portion of the plurality of first protruding portions and a (2N+1)-th protruding portion of the plurality of first protruding portions, which are lined up in the second direction.

2. The semiconductor device according to claim 1, further comprising:

a plurality of first semiconductor layers formed so as to line up in the second direction; and a plurality of second semiconductor layers formed so as to line up in the second direction, wherein a N-th semiconductor layer of the plurality of first semiconductor layers lined up in the second direction is in contact with each of an upper surface of the first semiconductor region formed in each of the (2N−1)-th protruding portion of the plurality of first protruding portions and the 2N-th protruding portion of the plurality of first protruding portions, which are lined up in the second direction, and a side surface of the first semiconductor region formed in each of the (2N−1)-th protruding portion of the plurality of first protruding portions and the 2N-th protruding portion of the plurality of first protruding portions, which are lined up in the second direction, wherein a N-th semiconductor layer of the plurality of second semiconductor layers lined up in the second direction is in contact with each of an upper surface of the second semiconductor region formed in each of the 2N-th protruding portion of the plurality of first protruding portions and the (2N+1)-th protruding portion of the plurality of first protruding portions, which are lined up in the second direction, and a side surface of the second semiconductor region formed in each of the 2N-th protruding portion of the plurality of first protruding portions and the (2N+1)-th protruding portion of the plurality of first protruding portions, which are lined up in the second direction, wherein the plurality of first plugs is electrically connected with the first semiconductor region formed in each of the plurality of first protruding portions via the plurality of first semiconductor layers, respectively, and wherein the plurality of second plugs is electrically connected with the second semiconductor region formed in each of the plurality of first protruding portions via the plurality of second semiconductor layers, respectively.

3. The semiconductor device according to claim 1, further comprising:

a plurality of second protruding portions each protruded from the upper surface of the semiconductor substrate and each extended in the first direction, each of the plurality of second protruding portions being a part of the semiconductor substrate, and each of the plurality of second protruding portions being formed between two of the plurality of first protruding portions lined up in the second direction, which are arranged next to each other, wherein the N-th plug of the plurality of first plugs lined up in the second direction is electrically connected with the first one of the plurality of second protruding portions, which is located between the (2N−1)-th protruding portion of the plurality of first protruding portions and the 2N-th protruding portion of the plurality of first protruding portions, which are lined up in the second direction, and wherein the N-th plug of the plurality of second plugs lined up in the second direction is electrically connected with the second one of the plurality of second protruding portions, which is located between the 2N-th protruding portion of the plurality of first protruding portions and the (2N+1)-th protruding portion of the plurality of first protruding portions, which are lined up in the second direction.

4. The semiconductor device according to claim 3, wherein, in plan view, the first one of the plurality of second protruding portions, which is electrically connected with the N-th plug of the plurality of first plugs, is spaced apart from the plurality of second plugs, and wherein, in plan view, the second one of the plurality of second protruding portions, which is electrically connected with the N-th plug of the plurality of second plugs, is spaced apart from the plurality of first plugs.

5. The semiconductor device according to claim 1, wherein the plurality of first plugs lined up in the second direction is spaced apart from one another, and wherein the plurality of second plugs lined up in the second direction is spaced apart from one another.

6. The semiconductor device according to claim 5, wherein an electrical potential of the N-th plug of the plurality of second plugs and an electrical potential of the (N+1)-th plug of the plurality of second plugs, which are lined up in the second direction, are controlled separately.

7. The semiconductor device according to claim 1, wherein an operation of a first non-volatile storage element comprised of a pair of the first semiconductor region and the second semiconductor region formed in the (2N−1)-th protruding portion of the plurality of first protruding portions lined up in the second direction and an operation of a second non-volatile storage element comprised of a pair of the first semiconductor region and the second semiconductor region formed in the 2N-th protruding portion of the plurality of first protruding portions lined up in the second direction are separately controlled with each other.

* * * * *